(12) United States Patent
Yen et al.

(10) Patent No.: US 11,322,454 B2
(45) Date of Patent: May 3, 2022

(54) SEMICONDUCTOR DEVICE PACKAGES AND METHOD OF MANUFACTURING THE SAME

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/717,948

(22) Filed: Dec. 17, 2019

(65) Prior Publication Data

US 2021/0183787 A1   Jun. 17, 2021

(51) Int. Cl.
*H01L 23/552* (2006.01)
*H01L 23/31* (2006.01)
*H01L 21/56* (2006.01)

(52) U.S. Cl.
CPC .......... *H01L 23/552* (2013.01); *H01L 21/561* (2013.01); *H01L 21/568* (2013.01); *H01L 23/3185* (2013.01); *H01L 23/3192* (2013.01)

(58) Field of Classification Search
None
See application file for complete search history.

(56) References Cited

U.S. PATENT DOCUMENTS

| 7,687,895 | B2 | 3/2010 | Brunnbauer et al. |
| 2008/0318395 | A1* | 12/2008 | Farnworth ........... B23K 26/044 438/462 |
| 2009/0294985 | A1* | 12/2009 | Gomez ............... H01L 23/3114 257/774 |
| 2019/0090825 | A1* | 3/2019 | Danzer ............. H01L 27/14659 |
| 2020/0098698 | A1* | 3/2020 | Patten ................ H01L 23/3128 |
| 2021/0125959 | A1* | 4/2021 | Matsuura .............. H01L 23/552 |

* cited by examiner

*Primary Examiner* — Jay C Chang
(74) *Attorney, Agent, or Firm* — Foley & Lardner LLP

(57) ABSTRACT

A semiconductor device package includes an electronic component, an infrared blocking layer, an upper protection layer and a side protection layer. The infrared blocking layer includes a first portion disposed over the electronic component. The infrared blocking layer includes a second portion surrounding the electronic component. The first portion is integral with the second portion. The upper protection layer is disposed on the first portion of the infrared blocking layer. The side protection layer is disposed on the second portion of the infrared blocking layer. The upper protection layer and the side protection layer are formed of different materials.

15 Claims, 17 Drawing Sheets

SEMICONDUCTOR DEVICE PACKAGES AND METHOD OF MANUFACTURING THE SAME

BACKGROUND

1. Field of the Disclosure

The present disclosure relates to semiconductor device packages, and more particular to semiconductor device packages and methods of manufacturing the same.

2. Description of the Related Art

Most of electromagnetic interface (EMI) shielding layers or infrared blocking layers on package structures are formed by sputtering metal layers on molding compounds, molded packages or silicon to achieve EMI protection or infrared isolation. However, the metal layer specifies additional space for electrically connection to substrates of package structures, which increases the size of the whole package structure and reduces the layout efficiency in a package substrate.

SUMMARY

In some embodiments, the present disclosure discloses a semiconductor device package. The semiconductor device package includes an electronic component, an infrared blocking layer, an upper protection layer and a side protection layer. The infrared blocking layer includes a first portion disposed over the electronic component. The infrared blocking layer includes a second portion surrounding the electronic component. The first portion is integral with the second portion. The upper protection layer is disposed on the first portion of the infrared blocking layer. The side protection layer is disposed on the second portion of the infrared blocking layer. The upper protection layer and the side protection layer are formed of different materials.

In some embodiments, the present disclosure discloses a semiconductor device package. The semiconductor device package includes an electronic component, an infrared blocking layer, and a protection layer. The infrared blocking layer encapsulates the electronic component. The protection layer encapsulates the infrared blocking layer. The protection layer is formed of a photosensitive material.

In some embodiments, the present disclosure discloses a method of manufacturing a semiconductor package device. The method includes providing a carrier, disposing an adhesive layer on the carrier, disposing electronic components having conductive components attached thereon on the adhesive layer, disposing an infrared blocking layer on the electronic components and the adhesive layer, disposing a patterned protection layer on the infrared blocking layer to form semiconductor package devices, and separating the semiconductor package devices from the carrier.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
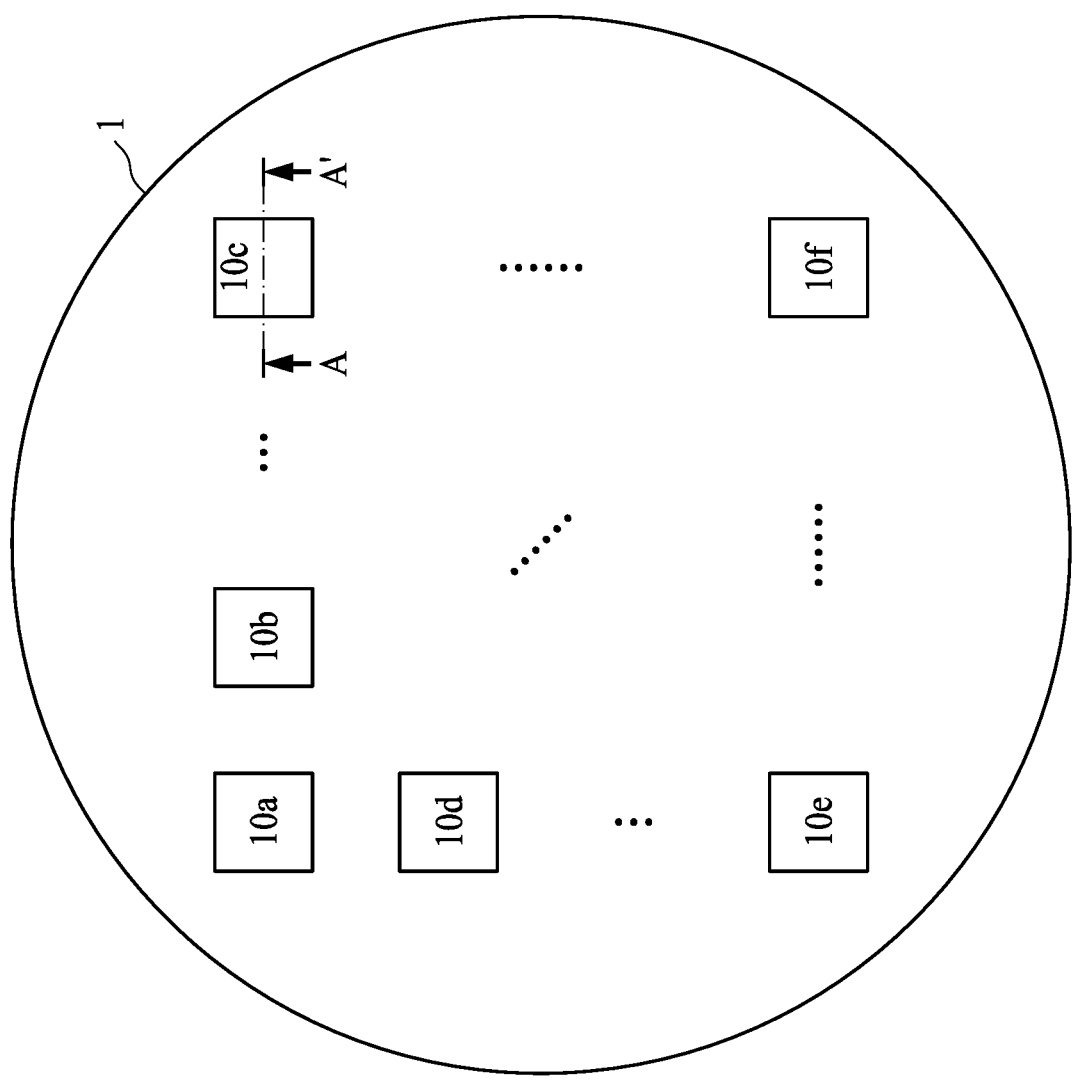
FIG. 1 illustrates a top view of a wafer level chip scale package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

An EMI shielding layer or infrared blocking layer made of metal materials are under risks of being scratched or peeling during a manufacturing process of package structures. This would severely disable the function of infrared blocking or EMI protection of the metal layer. In addition, in a wafer level chip scale package, the sidewalls of each single chip are provided with an EMI shielding layer or infrared blocker. As a result, the scribe lines has to be wide enough, which increases the size of the package structure and reduces the area efficiency.

FIG. 1 illustrates a top view of a wafer level chip scale package according to some embodiments of the present disclosure. Semiconductor device packages 10a, 10b, 10c, 10d, 10e, 10f and etc. are arranged in a matrix on a wafer 1.

Figure 2:
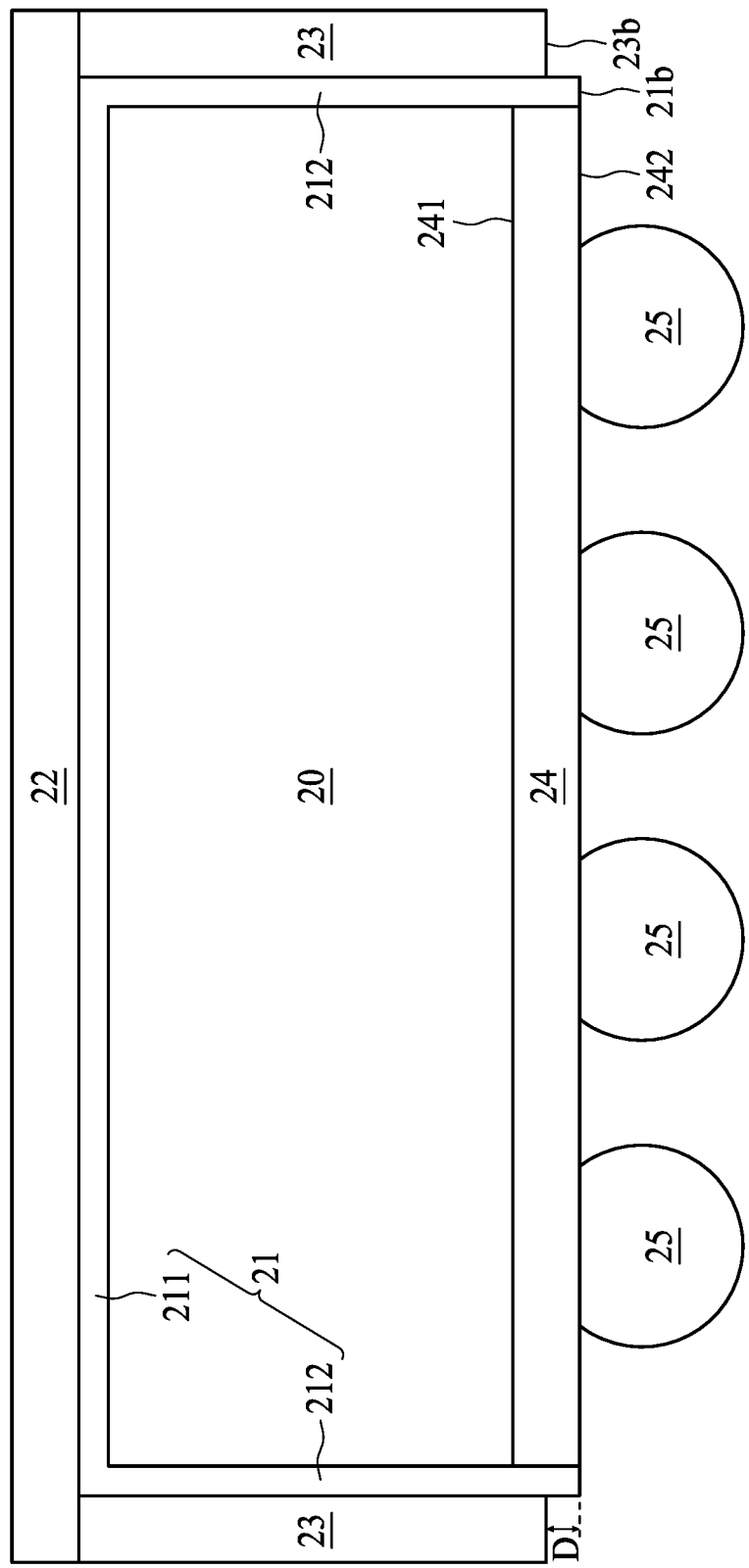
FIG. 2 illustrates a cross-sectional view of a semiconductor device package according to an embodiment of the present disclosure.

FIG. 2 illustrates a cross-sectional view of a semiconductor device package 10c, taken along line A-A' in FIG. 1, according to an embodiment of the present disclosure. Referring to FIG. 2, the semiconductor device package 10c includes an electronic component 20 and an infrared blocking layer 21. The infrared blocking layer 21 functions to provide EMI shielding or infrared isolation for the electronic components 20. Specifically, the infrared blocking layer 21 includes a first portion 211 and a second portion 212. The first portion 211 is disposed on the electronic component 20, and the second portion 212 surrounds the electronic component 20. The first portion 211 is integral with the second portion 212.

In addition, the semiconductor device package 10c includes an upper protection layer 22 and a side protection layer 23 for protecting the infrared blocking layer 21 from damage. The upper protection layer 22 is disposed on the first portion 211 of the infrared blocking layer 21. The side protection layer 23 is disposed on the second portion 212 of the infrared blocking layer 21 and surrounds the electronic component 20. The upper protection layer 22 and the side protection layer 23 are formed of different materials. Suitable materials for the upper protection layer 22, side protection layer 23 and infrared blocking layer 21 may depend on applications, as discussed below.

The upper protection layer 22 is formed of one of a solder resist, a first metal and a second metal. The first metal includes an electrically conductive metal. The second metal includes an electrically and thermally conductive metal, for example, nickel. The second metal facilitates the upper protection layer 22 to serve as a heat sink. The side protection layer 23 is formed of one of a solder resist layer and a molding compound. The infrared blocking layer 21 is formed of one of the first metal and the second metal.

In the present embodiment, the upper protection layer 22 is formed of solder resist. The side protection layer 23 is formed of molding compound. The infrared blocking layer 21 is formed of the first metal. The upper protection layer 22 has a surface on which a marking is provided. The marking includes at least one pattern. In an embodiment, the at least one pattern is formed by a lithography process. To ensure a smooth image transfer of the marking in a lithography process, a photosensitive material, such as solder resist in the present embodiment, is selected for the upper protection layer 22. In some comparative approaches, a molding compound layer is formed on a conductive layer that functions to provide EMI shielding or infrared blocking. Moreover, a marking may subsequently be formed by using laser. The molding compound layer, however, may not effectively block laser from damaging the underlying conductive layer, resulting in degraded EMI shielding or infrared blocking function of the conductive layer. Furthermore, as not a photosensitive material, molding compound and thus such molding compound layer is not suitable for use in a lithography process as in an embodiment of the present disclosure for forming a marking.

Moreover, the semiconductor device package 10c includes a redistribution layer (RDL) 24. The RDL 24 has a first side 241 and a second side 242 opposite to the first side 241. The electronic component 20 is disposed on the first side 241 of the RDL 24. A plurality of conductive components 25 is disposed on the second side 242 of the RDL 24. The infrared blocking layer 21 has a first bottom surface 21b distant from the upper protection layer 22. The side protection layer 23 has a second bottom surface 23b distant from the upper protection layer 22. The first bottom surface 21b is more distant from the upper protection layer 22 than the second bottom surface 23b by a gap D. A height of the gap D is about 1 μm.

Figure 3:
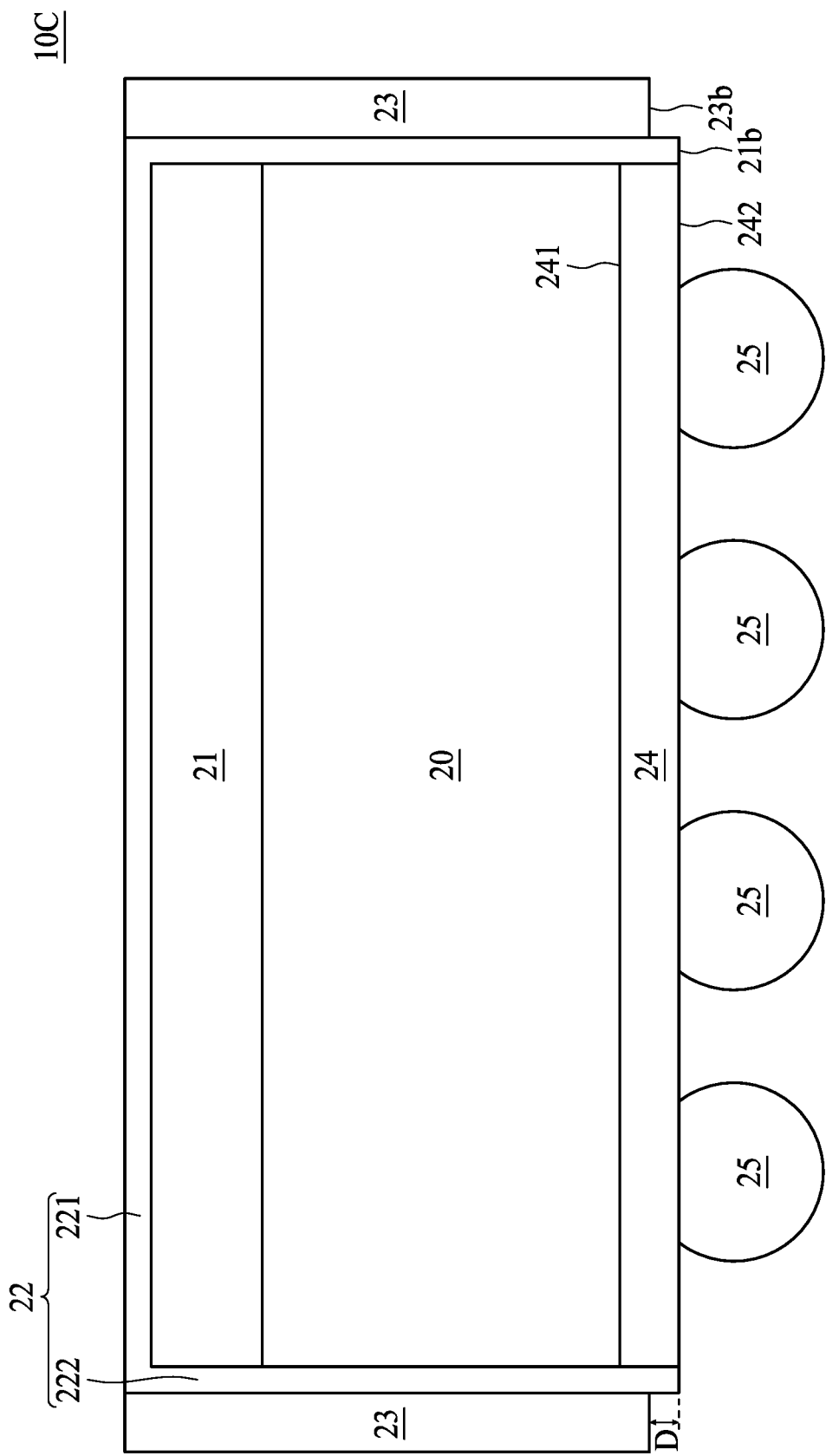
FIG. 3 illustrates a cross-sectional view of a semiconductor device package according to another embodiment of the present disclosure.

FIG. 3 illustrates a cross-sectional view of a semiconductor device package 10c, taken along line A-A' in FIG. 1, according to another embodiment of the present disclosure. Referring to FIG. 3, the semiconductor device package 10c includes an electronic component 20, an infrared blocking layer 21, an upper protection layer 22 and a side protection layer 23. The infrared blocking layer 21 is disposed on the electronic component 20. The upper protection layer 22 includes a first portion 221 and a second portion 222. The first portion 221 is disposed on the infrared blocking layer 21. The second portion 222 surrounds the electronic component 20 and the infrared blocking layer 21. The first portion 221 is integral with the second portion 222. The side protection layer 23 is disposed on the second portion 222 of the upper protection layer 22, and surrounds the electronic component 20 and the infrared blocking layer 21. The upper protection layer 22 and the side protection layer 23 are formed of different materials. Suitable materials for the upper protection layer 22, side protection layer 23 and infrared blocking layer 21 may depend on applications, as discussed below.

In the present embodiment, the upper protection layer 22 is formed of the first metal. The side protection layer 23 is formed of one of the solder resist and the molding compound. The infrared blocking layer 21 is formed of the second metal, for example, nickel. Accordingly, the infrared blocking layer 21 also serves as a heat sink. The upper protection layer 22 has a surface on which a marking is provided. The marking includes at least one pattern, which may be formed by, for example, a lithography process.

Moreover, the semiconductor device package 10c includes a redistribution layer (RDL) 24. The RDL 24 has a first side 241 and a second side 242 opposite to the first side 241. The electronic component 20 is disposed on the first side 241 of the RDL 24. A plurality of conductive components 25 is disposed on the second side 242 of the RDL 24. The upper protection layer 22 has a first bottom surface 22b. The side protection layer 23 has a second bottom surface 23b distant from the upper protection layer 22. The first bottom surface 22b is more distant from the upper protection layer 22 than the second bottom surface 23b by a gap D.

Figure 4:
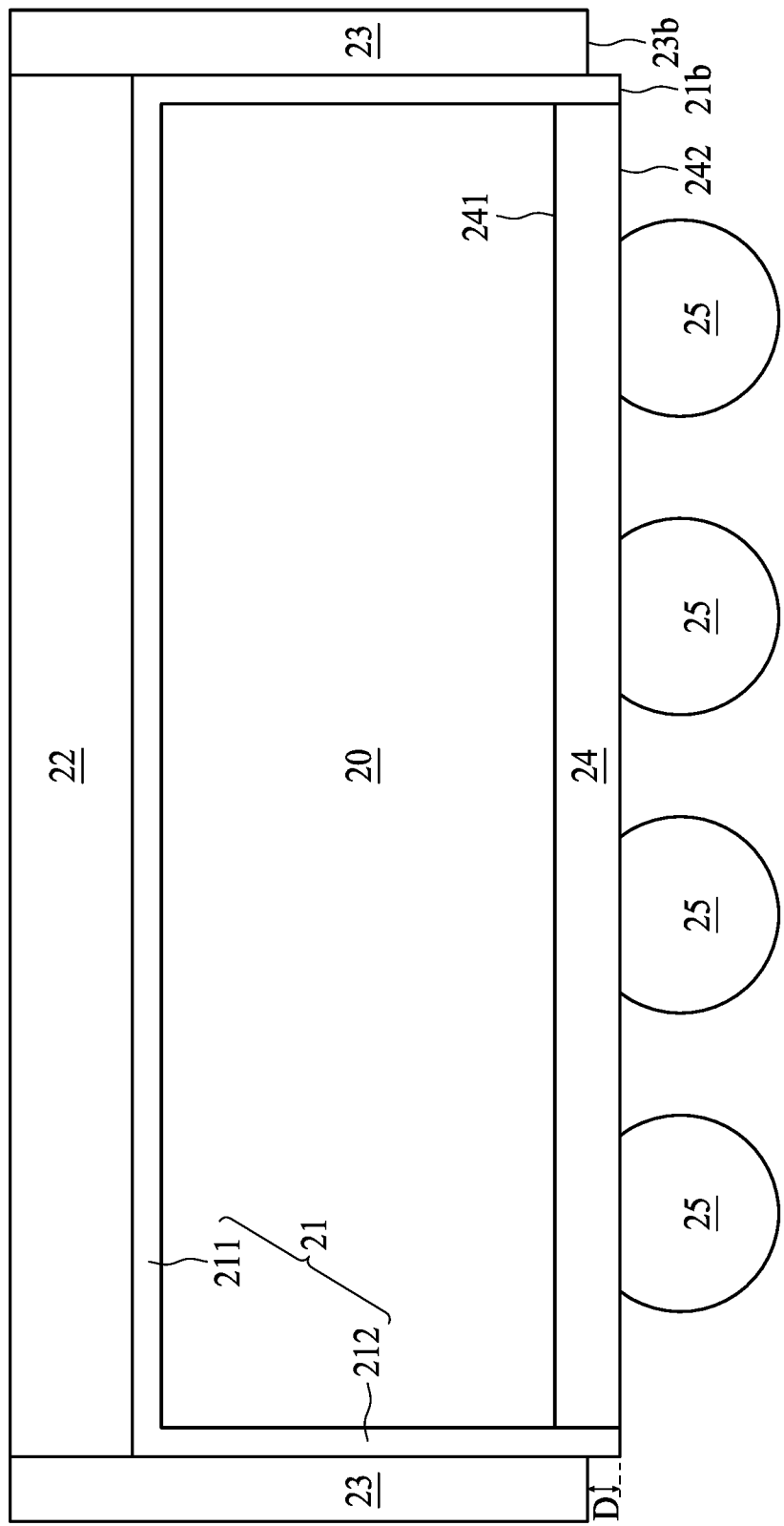
FIG. 4 illustrates a cross-sectional view of a semiconductor device package according to yet another embodiment of the present disclosure.

FIG. 4 illustrates a cross-sectional view of a semiconductor device package 10c, taken along line A-A' in FIG. 1, according to yet another embodiment of the present disclosure. Referring to FIG. 4, the semiconductor device package 10c includes an electronic component 20, an infrared blocking layer 21, an upper protection layer 22 and a side protection layer 23. The infrared blocking layer 21 includes a first portion 211 and a second portion 212. The first portion 211 is disposed on the electronic component 20. The second portion 212 surrounds the electronic component 20. The first portion 211 is integral with the second portion 212. The upper protection layer 22 is disposed on the first portion 211 of the infrared blocking layer 21. The side protection layer 23 is disposed on the second portion 212 of the infrared blocking layer 21 and the sides of the upper protection layer 22. In addition, the side protection layer 23 surrounds the electronic component 20 and the upper protection layer 22. The upper protection layer 22 and the side protection layer 23 are formed of different materials. Suitable materials for the upper protection layer 22, side protection layer 23 and infrared blocking layer 21 may depend on applications, as discussed below.

In the present embodiment, the upper protection layer 22 is formed of the second metal. The side protection layer 23 is formed of one of solder resist and molding compound. The infrared blocking layer 21 is formed of the first metal. The upper protection layer 22 thus also serves as a heat sink. A thickness of the infrared blocking layer 21 is larger than 500 nm. The upper protection layer 22 has a surface on which a marking is provided. The marking including at least one pattern, which may be formed by a lithography process.

Moreover, the semiconductor device package 10c includes a redistribution layer (RDL) 24. The RDL 24 has a first side 241 and a second side 242 opposite to the first side 241. The electronic component 20 is disposed on the first side 241 of the RDL 24. A plurality of conductive components 25 is disposed on the second side 242 of the RDL 24. The infrared blocking layer 21 has a first bottom surface 21b distant from the upper protection layer 22. The side protection layer 23 has a second bottom surface 23b distant from the upper protection layer 22. The first bottom surface 21b is more distant from the upper protection layer 22 than the second bottom surface 23b by a gap D.

Figure 5:
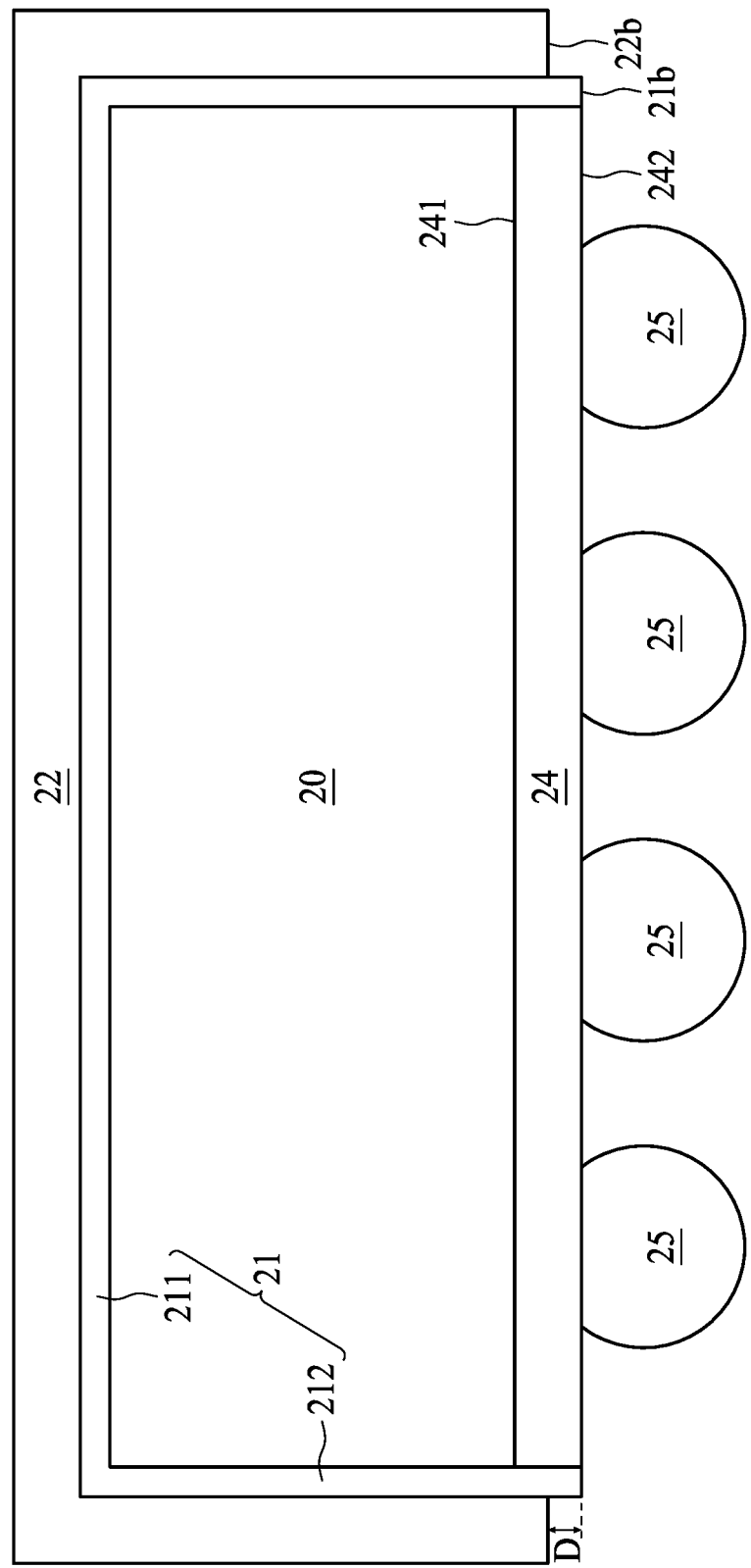
FIG. 5 illustrates a cross-sectional view of a semiconductor device package according to still another embodiment of the present disclosure.

FIG. 5 illustrates a cross-sectional view of a semiconductor device package 10c, taken along line A-A' in FIG. 1, according to still another embodiment of the present disclosure. The semiconductor device package 10c in FIG. 5 is similar to the semiconductor device package 10c described and illustrated with reference to FIG. 2 except that, for example, the upper protection layer 22 and the side protection layer 23 in FIG. 5 are made of a same material. Specifically, in the present embodiment, the upper protection layer 22 and the side protection layer 23, which are integral with each other, is formed of solder resist, while the infrared blocking layer 21 is formed of one of the first metal and the second metal.

Figure 6A:
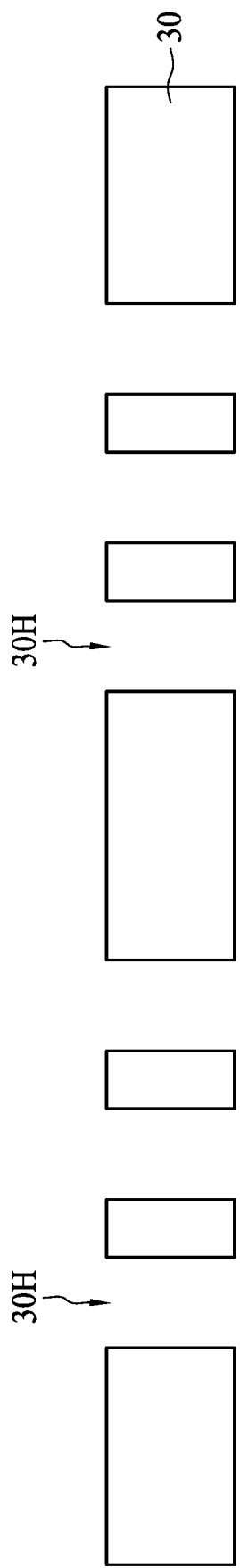
FIG. 6A, FIG. 6B, FIG. 6C, FIG. 6D, FIG. 6E, and FIG. 6F illustrate a method of manufacturing a semiconductor device package as shown in FIG. 5.

FIG. 6A through FIG. 6F illustrate a method of manufacturing a semiconductor device package as shown in FIG. 5. As shown in FIG. 6A, a patterned carrier 30, including recesses or holes 30H defined therein, is provided.

Figure 6B:
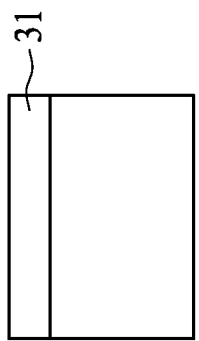
Figure 6B:
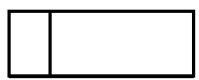
Figure 6B:
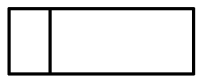
Figure 6B:
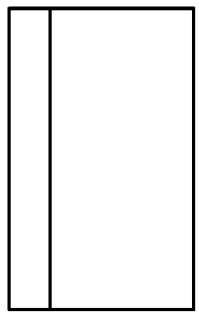
Figure 6B:
Figure 6B:
Figure 6B:
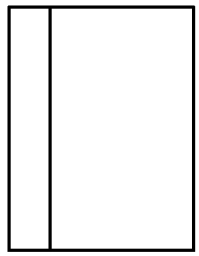

Referring to FIG. 6B, an adhesive layer 31 is formed on the patterned carrier 30.

Figure 6C:
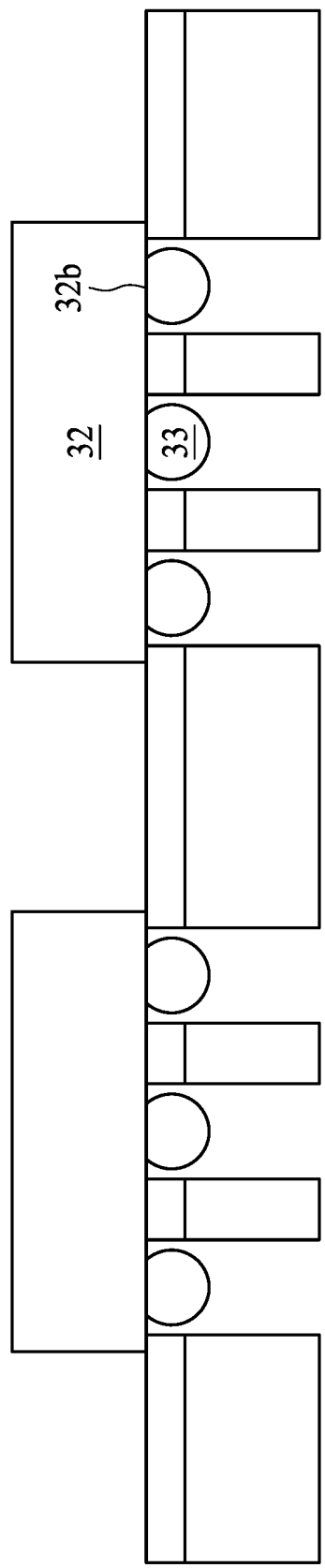

Referring to FIG. 6C, an electronic component 32 provided with conductive components 33 is attached on the adhesive layer 31 by, for example, a pick-and-place process. The conductive components 33 are disposed on a bottom surface 32b of the electronic component 32, and correspond in position to the recesses 30H. As such, in attaching the electronic component 32, the conductive components 33 are accommodated in the recesses 30H and thus are kept off the adhesive layer 31.

Figure 6D:
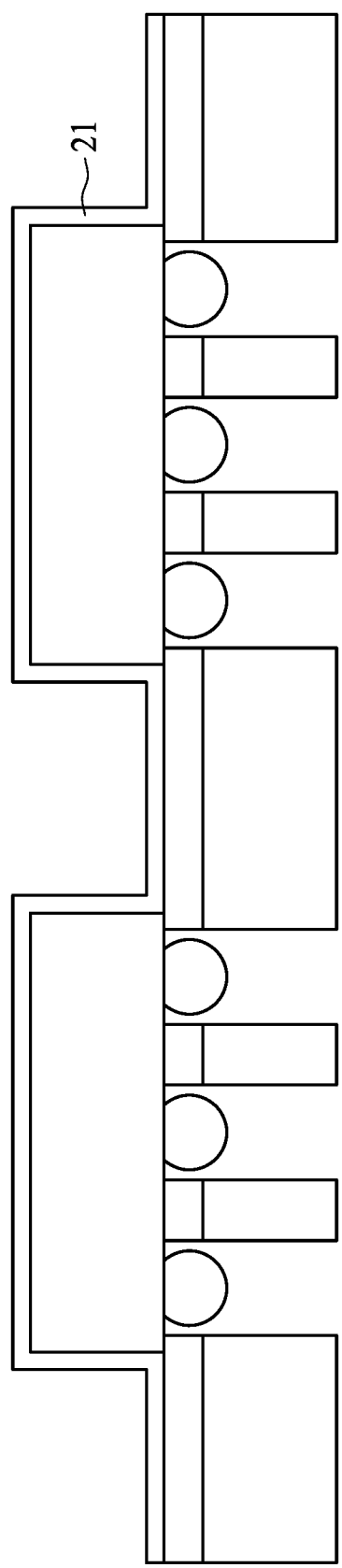

Referring to FIG. 6D, an infrared blocking layer 21 is conformally formed on the adhesive layer 31 and the electronic component 32 by, for example, a sputtering process.

Figure 6E:
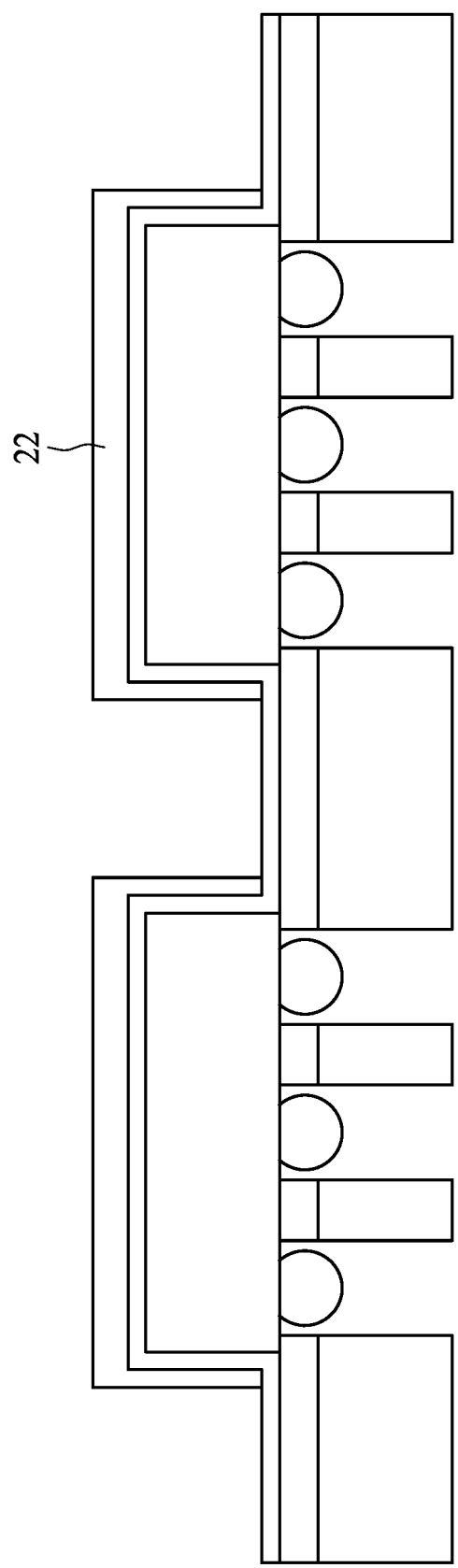

Referring to FIG. 6E, a patterned protection layer 22 is formed on the structure as shown in FIG. 6D by, for example, a coating process followed by a lithography process, resulting in semiconductor device packages having a similar or identical structure as the semiconductor device package 10c. The patterned protection layer 22 includes a photosensitive material. In an embodiment, the photosensitive material includes titanium. A thickness of the photosensitive material is in a range of about 10 μm to about 20 μm.

Figure 6F:
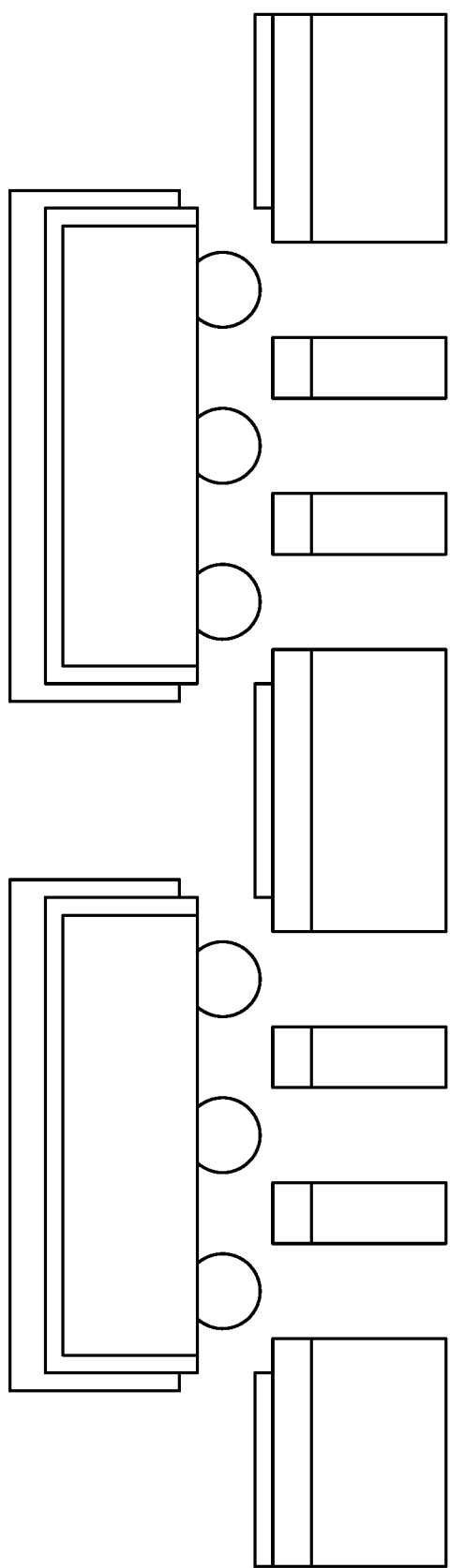

Referring to FIG. 6F, a semiconductor device package is then separated from the patterned carrier 30. In an embodiment, prior to the separation, a marking is formed on the patterned protection layer 22 by a lithography process. The marking includes at least one pattern.

Figure 7A:
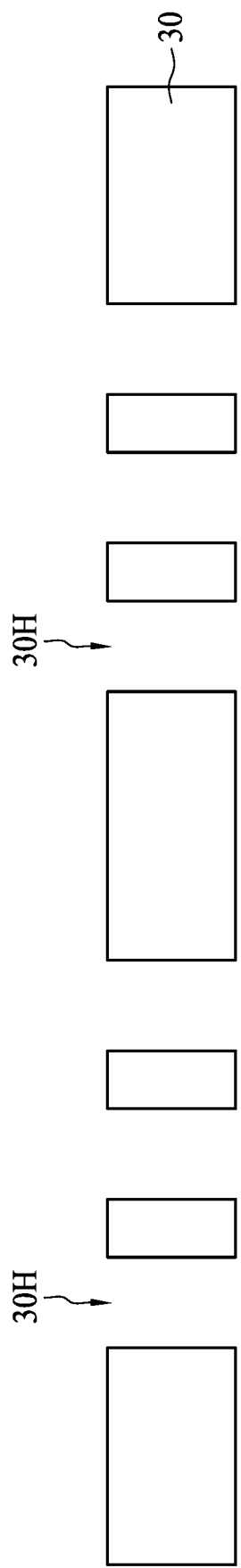
FIG. 7A, FIG. 7B, FIG. 7C, FIG. 7D, FIG. 7E, and FIG. 7F illustrate a method of manufacturing a semiconductor device package as shown in FIG. 3.

FIG. 7A through FIG. 7F illustrate a method of manufacturing a semiconductor device package as shown in FIG. 3. As shown in FIG. 7A, a patterned carrier 30, including recesses or holes 30H defined therein, is provided.

Figure 7B:
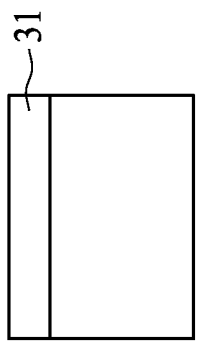
Figure 7B:
Figure 7B:
Figure 7B:
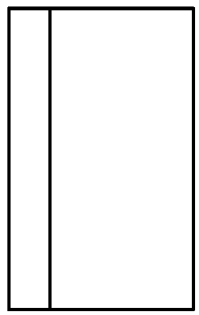
Figure 7B:
Figure 7B:
Figure 7B:
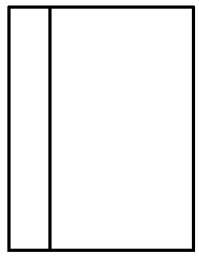

Referring to FIG. 7B, an adhesive layer 31 is formed on the patterned carrier 30.

Figure 7C:
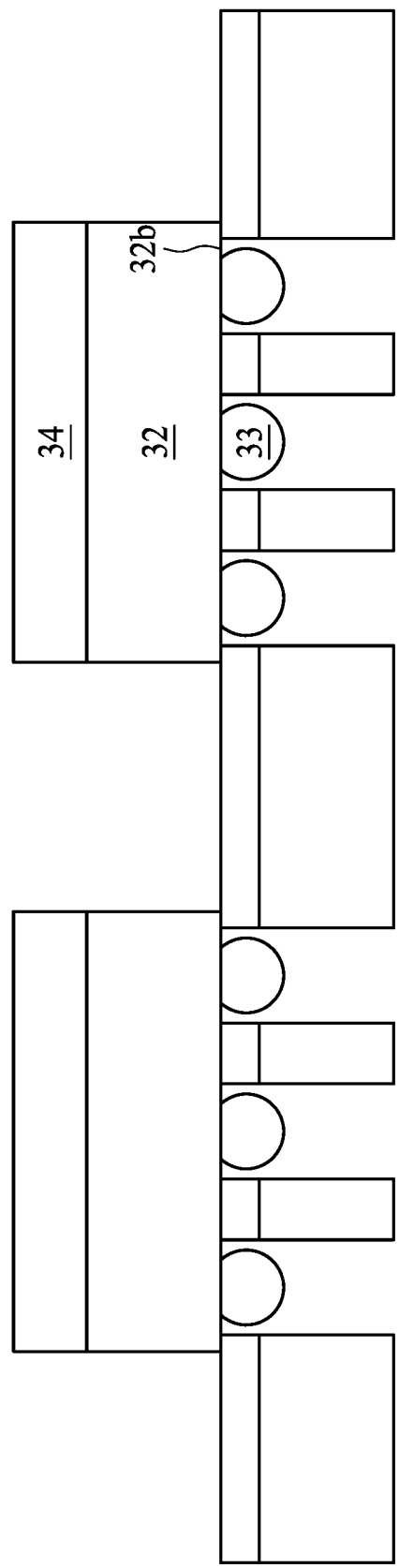

Referring to FIG. 7C, an electronic component 32 provided with conductive components 33 and a heat sink 34 is attached on the adhesive layer 31 by, for example, a pick-and-place process. The conductive components 33 are disposed on a bottom surface 32b of the electronic component 32, and correspond in position to the recesses 30H. As such, in attaching the electronic component 32, the conductive components 33 are accommodated in the recesses 30H and thus are kept off the adhesive layer 31. The heat sink layer 34 is patterned.

Figure 7D:
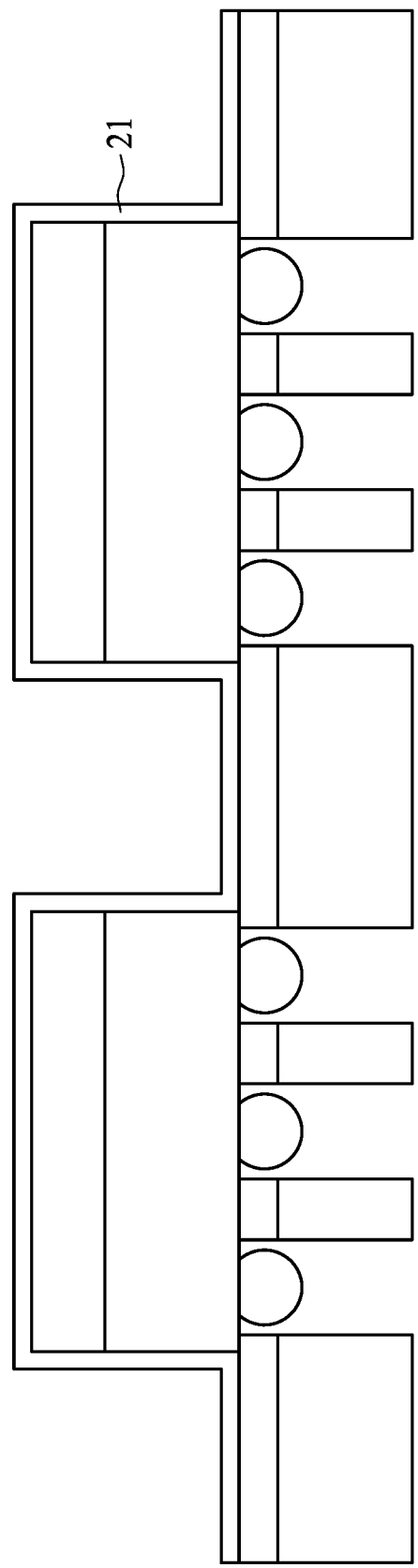

Referring to FIG. 7D, an infrared blocking layer 21 is conformally formed on the adhesive layer 31 and the heat sink layer 34 by, for example, a sputtering process.

Figure 7E:
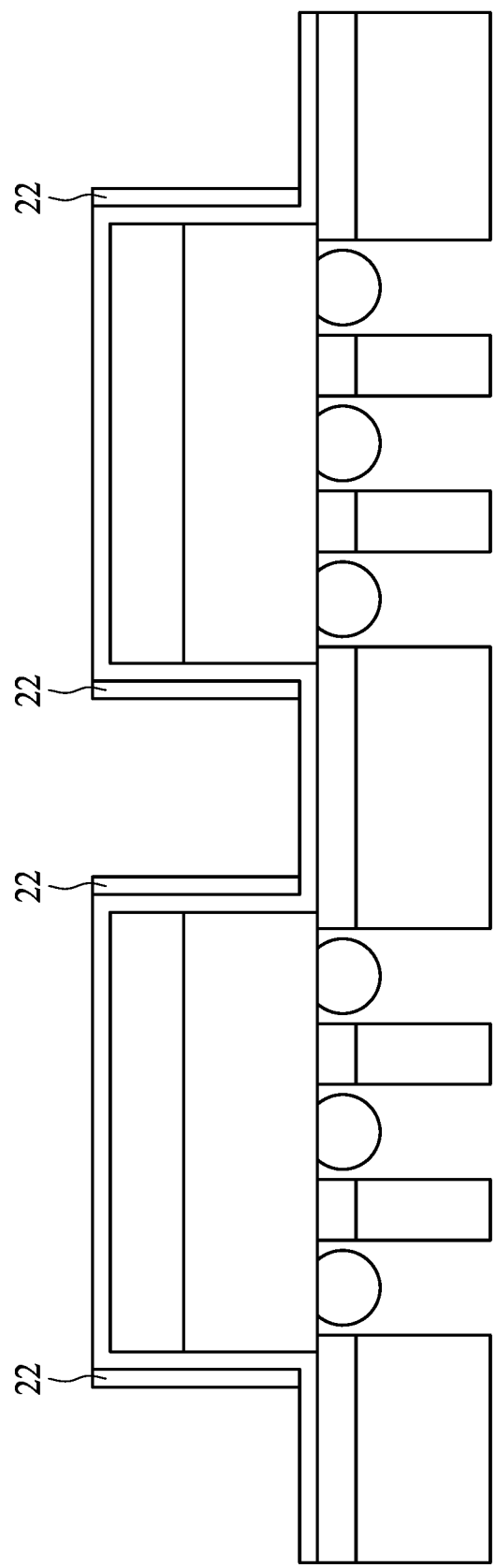

Referring to FIG. 7E, a patterned protection layer 22 is formed on the structure as shown in FIG. 7D by, for example, a coating process followed by a lithography process, resulting in semiconductor device packages having a similar or identical structure as the semiconductor device package 10c.

Figure 7F:
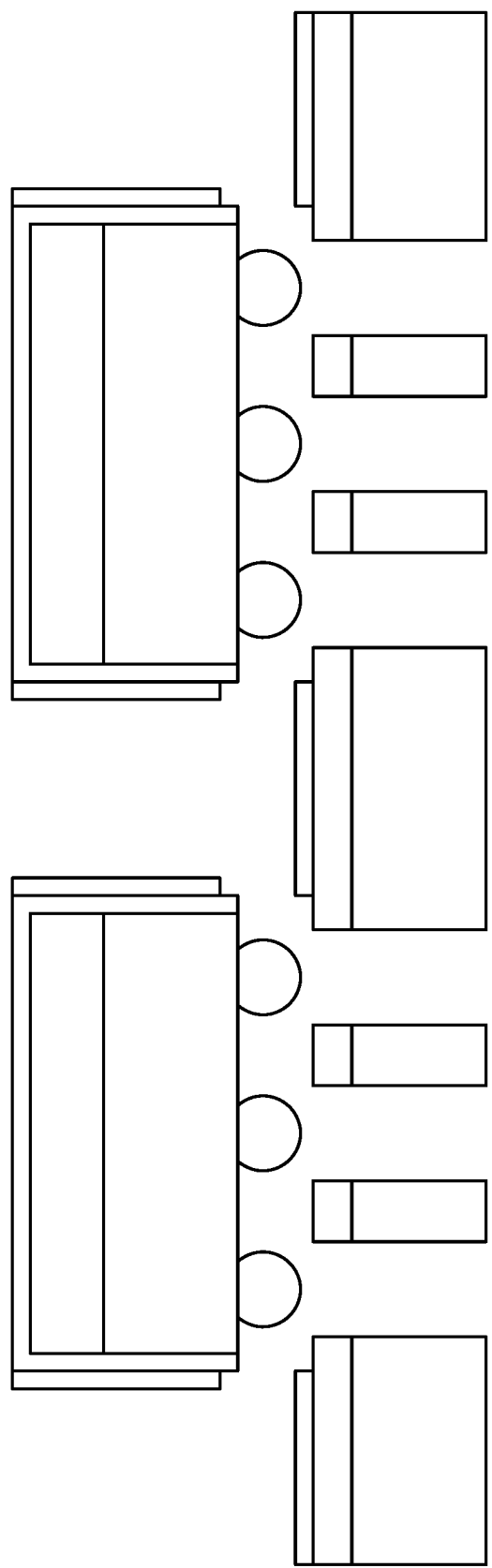

Referring to FIG. 7F, a semiconductor device package is then separated from the patterned carrier 30. In an embodiment, prior to the separation, a marking is formed on the heat sink layer 34 and/or the patterned protection layer 22 by a lithography process. The marking includes at least one pattern.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Ranges can be expressed herein as from one endpoint to another endpoint or between two endpoints. All ranges disclosed herein are inclusive of the endpoints, unless specified otherwise.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   an electronic component;
   an infrared blocking layer including a first portion disposed over the electronic component, and a second portion surrounding the electronic component, the first portion being integral with the second portion;
   an upper protection layer disposed on the first portion of the infrared blocking layer; and
   a side protection layer disposed on the second portion of the infrared blocking layer,
   wherein the upper protection layer and the side protection layer are formed of different materials, the infrared blocking layer has a first bottom surface distant from the upper protection layer, the side protection layer has a second bottom surface distant from the upper protection layer, the first bottom surface is more distant from the upper protection layer than the second bottom surface by a gap, and the infrared blocking layer and the side protection layer are separated by a portion of the upper protection layer.

2. The semiconductor device package of claim 1, wherein the upper protection layer is formed of one of a solder resist, a first metal and a second metal, the side protection layer is formed of one of a solder resist layer and a compound, and the infrared blocking layer is formed of one of the first metal and the second metal.

3. The semiconductor device package of claim 2, wherein the first metal includes an electrically conductive metal, and the second metal includes an electrically and thermally conductive metal.

4. The semiconductor device package of claim 2, wherein the upper protection layer is formed of the first metal, the side protection layer is formed of one of the solder resist and the compound, and the infrared blocking layer is formed of the second metal.

5. The semiconductor device package of claim 4, wherein the second metal comprises nickel.

6. The semiconductor device package of claim 2, wherein the upper protection layer is formed of the second metal, the side protection layer is formed of one of the solder resist and the compound, and the infrared blocking layer is formed of the first metal.

7. The semiconductor device package of claim 1, further comprising a redistribution layer (RDL) having a first side and a second side opposite to the first side, wherein the electronic component is disposed on the first side of the RDL.

8. The semiconductor device package of claim 7, further comprising a plurality of conductive components disposed on the second side of the RDL.

9. The semiconductor device package of claim 1, wherein the upper protection layer has a surface on which a marking is provided, the marking including at least one pattern.

10. The semiconductor device package of claim 1, wherein the upper protection layer encapsulates the infrared blocking layer disposed on the electronic component.

11. A semiconductor device package, comprising:
    an electronic component;
    an infrared blocking layer including a first portion disposed over the electronic component, and a second portion surrounding the electronic component, the first portion being integral with the second portion;

an upper protection layer disposed on the first portion of the infrared blocking layer; and a side protection layer disposed on the second portion of the infrared blocking layer, wherein the upper protection layer and the side protection layer are formed of different materials, the infrared blocking layer has a first bottom surface distant from the upper protection layer, the side protection layer has a second bottom surface distant from the upper protection layer, the first bottom surface is more distant from the upper protection layer than the second bottom surface by a gap, and the side protection layer is substantially flush with the first portion of the infrared blocking layer.

12. The semiconductor device package of claim 11, wherein the first bottom surface of the infrared blocking layer is lower than the second bottom surface of the side protection layer.

13. The semiconductor device package of claim 11, wherein the upper protection layer is formed of one of a solder resist, a first metal and a second metal, the side protection layer is formed of one of a solder resist layer and a compound, and the infrared blocking layer is formed of one of the first metal and the second metal.

14. The semiconductor device package of claim 13, wherein the first metal includes an electrically conductive metal, and the second metal includes an electrically and thermally conductive metal.

15. The semiconductor device package of claim 13, wherein the upper protection layer is formed of the solder resist, the side protection layer is formed of the compound, and the infrared blocking layer is formed of the first metal.

\* \* \* \* \*